(12) United States Patent
Kumar et al.

(10) Patent No.: US 12,326,407 B2
(45) Date of Patent: Jun. 10, 2025

(54) INSPECTION APPARATUS AND INSPECTION METHOD

(71) Applicant: ASML NETHERLANDS B.V., Veldhoven (NL)

(72) Inventors: Nitish Kumar, Eindhoven (NL); Richard Quintanilha, Heidenheim an der Brenz (DE); Markus Gerardus Martinus Maria Van Kraaij, Eindhoven (NL); Konstantin Tsigutkin, Eindhoven (NL); Willem Marie Julia Marcel Coene, Geldrop (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 18/200,947

(22) Filed: May 23, 2023

(65) Prior Publication Data
US 2023/0296533 A1 Sep. 21, 2023

Related U.S. Application Data

(63) Continuation of application No. 16/963,905, filed as application No. PCT/EP2019/050306 on Jan. 8, 2019, now Pat. No. 11,692,948.

(30) Foreign Application Priority Data

Jan. 30, 2018 (EP) .................................... 18154116

(51) Int. Cl.
*G01N 21/956* (2006.01)
*G02F 1/35* (2006.01)
*G03F 1/84* (2012.01)

(52) U.S. Cl.
CPC ........... *G01N 21/956* (2013.01); *G02F 1/353* (2013.01); *G03F 1/84* (2013.01); *G01N 2021/95676* (2013.01); *G01N 2201/06113* (2013.01)

(58) Field of Classification Search
CPC .............. G01N 21/956; G01N 21/8806; G03F 7/70616; G03F 7/7065; G02F 1/354
See application file for complete search history.

(56) References Cited

U.S. PATENT DOCUMENTS 3,536,407 A * 10/1970 Sandlin .............. G01N 21/8916
430/30
6,327,033 B1 * 12/2001 Ferguson ......... G01N 21/95607
356/394
(Continued)

FOREIGN PATENT DOCUMENTS

JP 2001168159 A * 6/2001
JP 2009156872 A * 7/2009
(Continued)

OTHER PUBLICATIONS

Assoufid et al."Compact X-ray and Extreme-Ultraviolet Light Sources", Optics & Photonics News, Jul./Aug. 2015, https://www.optica-opn.org/home/articles/volume_26/july_august_2015/features/compact_x-ray_and_extreme-ultraviolet_light_source/.*
(Continued)

*Primary Examiner* — Michael J Logie
*Assistant Examiner* — Jarreas Underwood
(74) *Attorney, Agent, or Firm* — Pillsbury Winthrop Shaw Pittman, LLP

(57) ABSTRACT

A method of inspection for defects on a substrate, such as a reflective reticle substrate, and associated apparatuses. The method includes performing the inspection using inspection radiation obtained from a high harmonic generation source and having one or more wavelengths within a wavelength
(Continued)

range of between 20 nm and 150 nm. Also, a method including performing a coarse inspection using first inspection radiation having one or more first wavelengths within a first wavelength range; and performing a fine inspection using second inspection radiation having one or more second wavelengths within a second wavelength range, the second wavelength range comprising wavelengths shorter than the first wavelength range.

20 Claims, 5 Drawing Sheets

(56) References Cited

U.S. PATENT DOCUMENTS

| | | | |
|---|---|---|---|
| 6,483,571 | B1 | 11/2002 | Shiraishi |
| 6,690,469 | B1 | 2/2004 | Shibata et al. |
| 11,493,753 | B1* | 11/2022 | Wood ............... G02B 27/10 |
| 2005/0105791 | A1* | 5/2005 | Lee ................... G01N 21/47 382/145 |
| 2005/0201514 | A1* | 9/2005 | Mann ................ G21K 1/062 378/43 |
| 2005/0243390 | A1* | 11/2005 | Tejnil ................ G21K 1/062 359/15 |
| 2009/0128792 | A1* | 5/2009 | Pellens ............. G03F 9/7084 355/53 |
| 2011/0211726 | A1* | 9/2011 | Moed ............ G06V 10/7515 712/E9.002 |
| 2014/0329174 | A1 | 11/2014 | Hamamoto et al. |
| 2015/0293457 | A1* | 10/2015 | Epple ............... G03F 7/7025 359/859 |
| 2016/0179012 | A1* | 6/2016 | Brandt ............ G03F 7/70033 250/504 R |
| 2016/0282280 | A1* | 9/2016 | Foad ................. G01N 21/95 |
| 2017/0045823 | A1 | 2/2017 | Quintanilha |
| 2017/0176346 | A1* | 6/2017 | Lange ............... G03F 7/7065 |
| 2017/0221194 | A1* | 8/2017 | Ebstein ........... G01N 21/956 |
| 2017/0301508 | A1* | 10/2017 | Ma ................... G03F 7/7065 |
| 2017/0315456 | A1 | 11/2017 | Lin et al. |
| 2018/0276806 | A1* | 9/2018 | Naka ................ G06T 7/0004 |
| 2019/0056655 | A1* | 2/2019 | Ekinci ................. G03F 1/84 |
| 2019/0331611 | A1* | 10/2019 | Ebstein ........... G02B 21/0016 |
| 2020/0348398 | A1* | 11/2020 | Baumgartner .......... G01S 17/06 |

FOREIGN PATENT DOCUMENTS

| | | | |
|---|---|---|---|
| KR | 20050104958 | | 11/2005 |
| KR | 20050104958 | A * | 11/2005 |
| KR | 102190305 | B1 * | 12/2016 |
| WO | 2017025392 | | 2/2017 |
| WO | 2017108404 | | 6/2017 |

OTHER PUBLICATIONS

International Search Report and Written Opinion issued in corresponding PCT Patent Application No. PCT/EP2019/050306, dated Apr. 18, 2019.
European Search Report issued in corresponding European Application No. 18154116, dated Jul. 30, 2018.
Ding, C. et al.: "High flux coherent super-continuum soft X-ray source driven by a single-stage, 10mJ, Ti:sapphire amplifier-pumped OPA", Optics Express, vol. 22, No. 5 (2014).
Graves, W.S. et al.: Compact x-ray source based on burst-mode inverse Compton scattering at 100 KHz, Physical Review Special Topics—Accelerators and Beams 17, vol. 120701 (2014).
Hadrich, S. et al.: "Single-pass high harmonic generation at high repetition rate and photon flux", Journal of Physics B: Atomic, Molecular and Optical Physics, vol. 49, No. 17 (Aug. 19, 2016).
Kapteyn, H. et al.: "Ultrahigh-resolution EUV Coherent Diffractive Imaging and Proposed EUVL Tools", KMLabs Inc. (Sep. 11, 2017).
Na, J. et al.: "Application of actinic mask review system for the preparation of HVM EUV lithography with defect free mask", Proc. of SPIE, vol. 10145 (Mar. 28, 2017).
Nakasuji, M. et al.: "Development of Coherent Extreme-Ultraviolet Scatterometry Microscope with High-Order Harmonic Generation Source for Extreme-Ultraviolet Mask Inspection and Metrology", Japanese Journal of Applied Physics, vol. 51 (2012).
Office Action issued in corresponding Chinese Patent Application No. 2019800110248, dated Nov. 30, 2022.

* cited by examiner

INSPECTION APPARATUS AND INSPECTION METHOD

This application is a continuation of U.S. patent application Ser. No. 16/963,905, filed Jul. 22, 2020, which is the U.S. national phase entry of PCT Patent Application No. PCT/EP2019/050306, which was filed on Jan. 8, 2019, which claims the benefit of priority of European Patent Application No. 18154116.0, filed on Jan. 30, 2018, each of the foregoing applications is incorporated herein in its entirety by reference.

FIELD

The present description relates to an inspection apparatus and a method for performing a measurement. In particular, it relates to an inspection apparatus and method for inspecting reticle substrates, reticle blanks and/or patterned reticles.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Multiple layers, each having a particular pattern and material composition, are applied to define functional devices and interconnections of the finished product.

In lithographic processes, it is desirable frequently to make measurements of the reticle at different stages of its manufacture, e.g., to monitor reticle quality. In particular, it is desirable to monitor for defects on the reticle. This presents particular difficulties for EUV reticles tuned for patterning and reflecting radiation in the EUV regime (e.g., having a wavelength in the region of about 13.5 nm). Such defects may take many forms, including pitting of the reticle surface, a contaminant (particle) on the reticle or an undesired variation of the pitch of the reticle multilayer. Any such reticle defects may be imaged onto the product (wafer) rendering the final device defective. Various tools for making such measurements are known, including scanning electron microscopes and various forms of scatterometers.

The known scatterometers tend to use light in the visible or near-IR wave range, which limits the resolution of the measurements and therefore the size of any defects which can be detected with any accuracy. On the other hand, the dimensions of these defects are so small that they cannot be imaged by optical metrology techniques. While scanning electron microscopy (SEM) is able to resolve these defects structures directly, SEM is much more time consuming than optical measurements.

It is known to decrease the wavelength of the radiation used during metrology, i.e., by moving towards extreme ultraviolet (EUV) having a wavelength in the region of radiation of 13.5 nm. Such radiation can better resolve small defects. Also, such radiation is of a similar or same wavelength as the imaging radiation used in EUV lithography and therefore the ability to detect defects with such radiation is indicative that the defect will be imaged. Furthermore, it is advantageous to inspect a reticle blank with 13.5 nm radiation because the multilayer mirror of which it is comprised is designed to reflect 13.5 nm, which means that defects in the multilayer structure can be detected more easily.

However, it is known that inspection using inspection radiation having a wavelength of 13.5 nm suffers from a low number of photons impinging on the sensor and, thus, relatively long measurement times.

It would be desirable to improve measurement speed of (e.g., EUV) reticle inspection, including inspection of the bare substrate, the reticle blank (with multilayer applied) or of the patterned reticle.

SUMMARY

According to a first aspect, there is method of inspection for detecting defects on a substrate for a reflective reticle, comprising: performing the inspection using first inspection radiation obtained from a high harmonic generation source and having one or more first wavelengths within a first wavelength range of between 20 nm and 150 nm.

According to a second aspect, there is provided method of inspection for detecting defects on a substrate for a reflective reticle, comprising: performing a coarse inspection using first inspection radiation having one or more first wavelengths within a first wavelength range; and performing a fine inspection using second inspection radiation having one or more second wavelengths within a second wavelength range, the second wavelength range comprising wavelengths shorter than the first wavelength range.

The features relating to the first aspect, which define wavelength ranges, angles of incidence, and number of wavelengths for the inspection radiation are all applicable to the first inspection of this second aspect.

According to a third aspect, there is provided an inspection apparatus operable to perform the method of the first or second aspects.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Before describing embodiments of the invention in detail, it is instructive to present an example environment in which embodiments of the present invention may be implemented.

Figure 1:
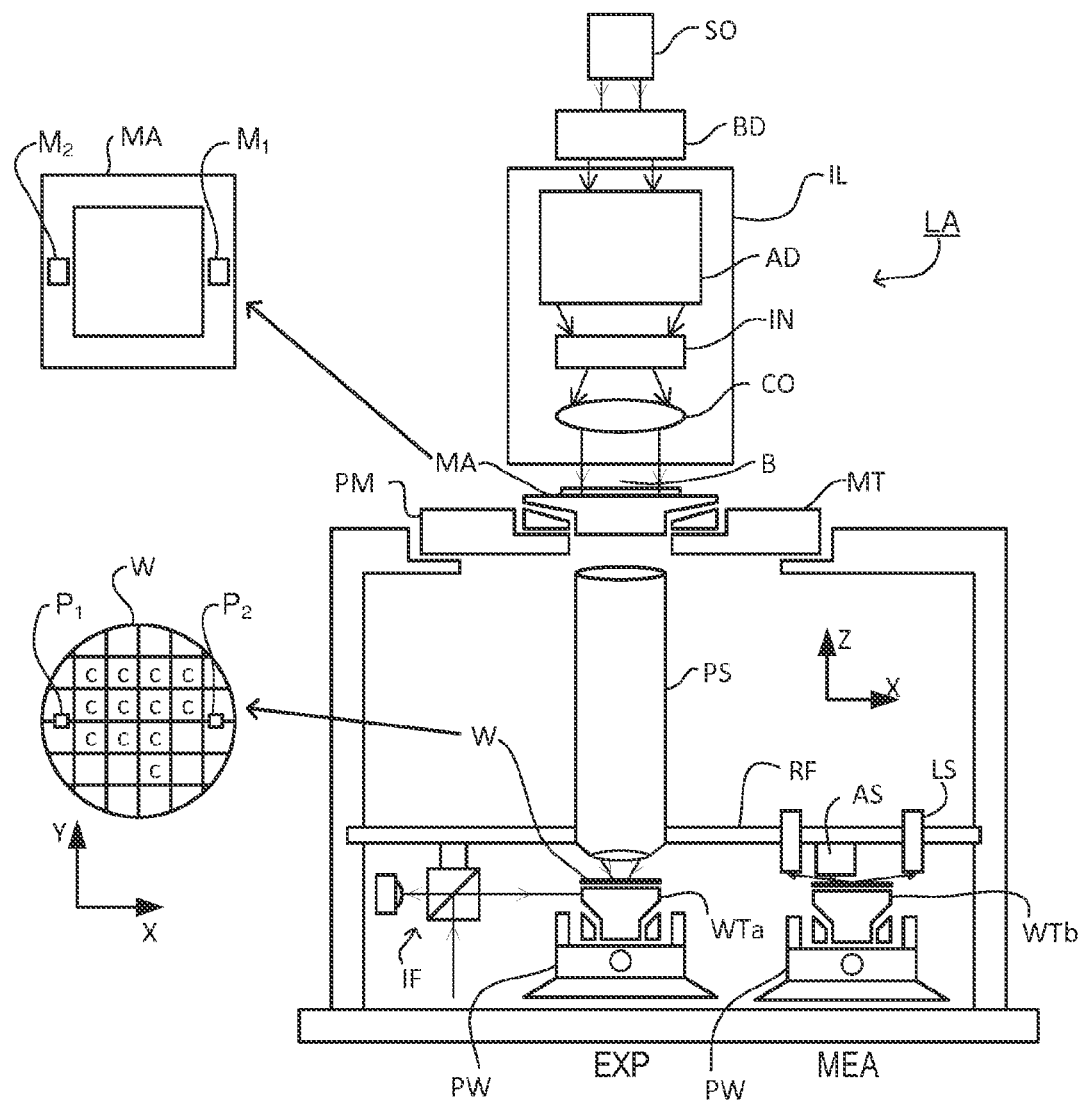
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV or EUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment mark may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Metrology tools may be developed which use sources that emit radiation in "soft X-ray" or EUV range, for example having wavelengths between 1 nm and 50 nm. Examples of such sources include Discharge Produced Plasma sources, Laser Produced Plasma Sources or High-order Harmonic Generation (HHG) sources. HHG sources are known to be able to provide large flux of collimated photons (high luminance) in the emitted light.

HHG sources used in metrology applications are illustrated and further described in United States Patent Application 20170315456, which is hereby incorporated in their entirety by reference. In metrology applications, such HHG sources may be used (for example) in normal incidence, very close to normal incidence (e.g., within 10 degrees from normal), at a grazing incidence (e.g., within 20 degrees from surface), at an arbitrary angle or at multiple angles (to obtain more measurement information in a single capture).

Figure 2:
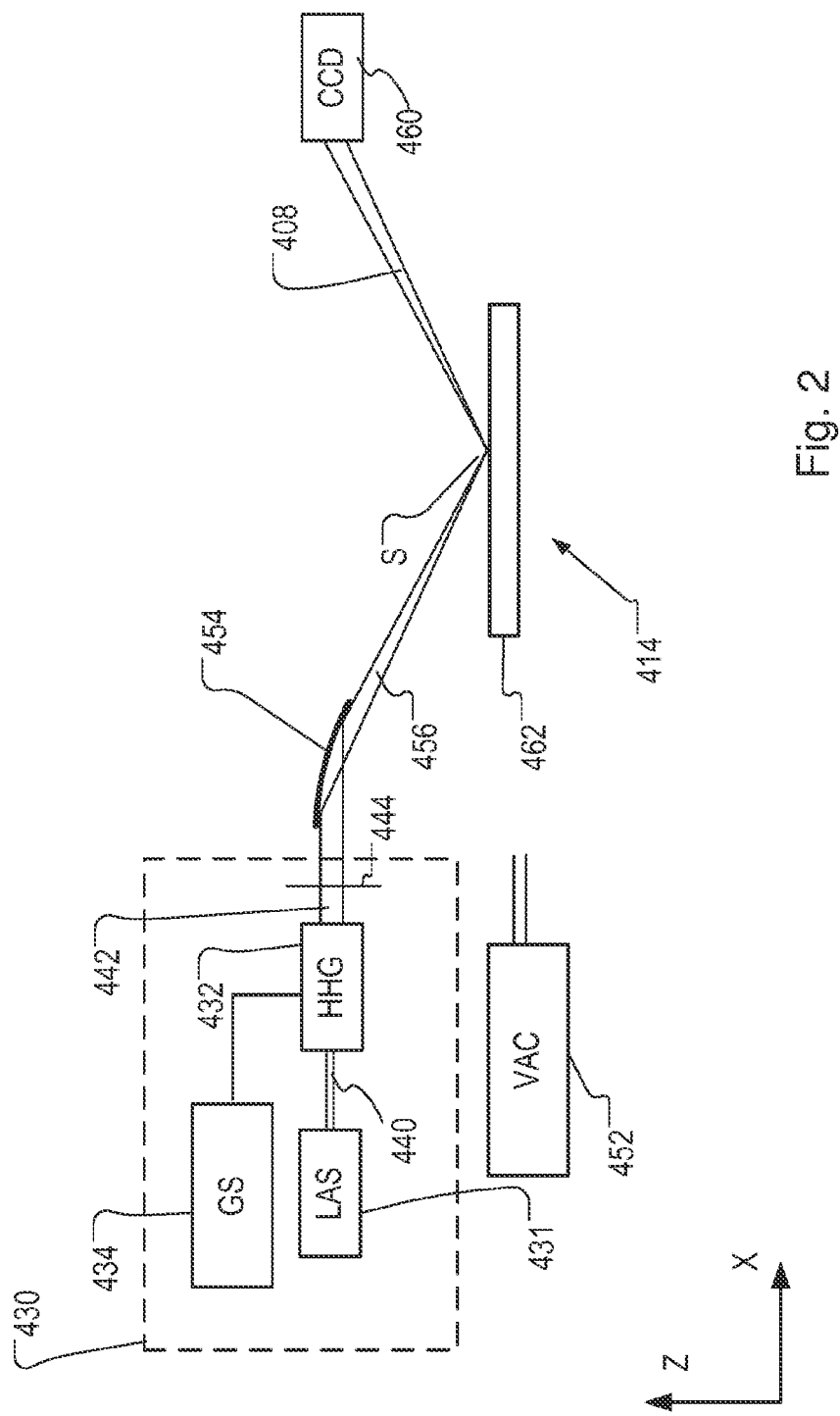
FIG. 2 depicts a metrology apparatus using a HHG source adaptable according to an embodiment of the invention.

FIG. 2 illustrates a metrology arrangement showing the radiation source 430 in more detail. Radiation source 430 is an HHG source for generating EUV radiation based on high harmonic generation (HHG) techniques. Main components of the radiation source 430 are a pump laser 431 and an HHG medium, such as a HHG gas cell 432 (a HHG solid surface medium may also be used). A gas supply 434 supplies suitable gas to the gas cell, where it is optionally ionized by an electric source (not shown). The pump laser 431 may be for example a fiber-based laser with an optical amplifier, producing pulses of infrared radiation lasting less than 1 ns (1 nanosecond) per pulse, with a pulse repetition rate up to several megahertz, as required. The wavelength may be for example in the region of 1 μm (1 micron). The laser pulses are delivered as a pump radiation beam 440 to the HHG gas cell 432, where a portion of the radiation is converted to higher frequencies. From the HHG gas cell 432 emerges a beam of measurement radiation 442 including coherent radiation of the desired wavelength or wavelengths.

The measurement radiation 442 may contain multiple wavelengths. If the radiation is also monochromatic, then measurement calculations (reconstruction) may be simplified, but it is easier with HHG to produce radiation with several wavelengths. These are matters of design choice, and may even be selectable options within the same apparatus. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials.

One or more filtering devices 444 may be provided. For example a filter such as a thin membrane of Aluminum (Al) may serve to cut the fundamental IR radiation (and undesired long-wavelength harmonics) from passing further into the inspection apparatus. A grating may be provided to select one or more specific harmonic wavelengths from among those generated in the gas cell 432. Some or all of the beam path may be contained within a vacuum environment, bearing in mind that EUV radiation is absorbed when traveling in air. The various components of radiation source 430 and illumination optics can be adjustable to implement different metrology 'recipes' within the same apparatus. For example different wavelengths and/or polarization can be made selectable.

From the radiation source 430, the filtered beam enters an inspection chamber where the substrate 462 is held for inspection by substrate support 414. The atmosphere within inspection chamber is maintained near vacuum by vacuum pump 452, so that the soft X-ray radiation can pass without undue attenuation through the atmosphere. The illumination system includes one or more optical elements 454 for focusing the radiation into a focused beam 456, and may comprise for example a two-dimensionally curved mirror, or a series of one-dimensionally curved mirrors, as described in the prior applications mentioned above. Diffraction gratings such as the spectroscopic gratings can be combined with such mirrors, if desired. The focusing is performed to achieve a round or elliptical spot under 10 μm in diameter, when projected onto the structure of interest. Substrate support 414 comprises for example an X-Y translation stage and a rotation stage, by which any part of the substrate W can be brought to the focal point of beam to in a desired orientation. Thus the radiation spot S is formed on the structure of interest. The radiation scattered 408 from the structure of interest is then detected by detector 460. This detector may be large enough to capture higher diffraction orders in addition to the specularly reflected radiation (zeroth order). Alternatively, one or more separate detectors are used for the higher diffraction orders (in combination with or instead of detector 460). The detector configuration will largely depend on the detection and metrology methods actually used, and whether the substrate being measured has been processed or not, for example.

Such an arrangement may be used to inspect any type of substrate. In the examples described herein, the substrate being inspected comprise a reticle (or mask) substrate, and more specifically reflective reticles such as those typically used for EUV lithography. EUV lithography uses imaging radiation having a wavelength smaller than 20 nm, and more specifically about 13.5 nm, thereby enabling printing of smaller features compared to using larger wavelength radiation. However, radiation at these wavelengths will be absorbed by transmissive optics and therefore reflective optics are used throughout the system including the reticle. Each reticle should be inspected to identify and/or characterize defects, as such defects may be imaged onto a wafer when used, resulting in defective devices (loss of yield). Reticle substrates may be inspected at different stages of manufacture; for example, the inspection stages may include:

substrate inspection, i.e., inspection of an unprocessed substrate, multilayer inspection, i.e., inspection of a "blank" comprising a substrate with at least the multilayer (reflective coating) applied, typically also having a back side coating and unpatterned absorber layer applied, and defect on absorber inspection, i.e., inspection of a patterned substrate on which the absorber layer has been patterned.

The concepts described herein are equally applicable to each of these inspection stages.

A single defect on a reticle has the potential to destroy the complete integrated circuit printed on the wafer, and hence a defect free reticle is important for enabling high volume manufacturing (HVM) in EUV metrology. The defects may comprise amplitude defects such as surface bumps, particles or pits which generate contrast changes at the wafer level during exposure, and phase defects such as bumps or pits buried within or below the multilayer, which cause a phase change in the reflected radiation.

There have been several methods used or described for EUV reticle defect metrology, but none are sufficient for HVM using EUV tools. Typical examples use optical scatterometry, scanning electron microscopy (SEM) or atomic force microscopy (AFM). SEM is capable of measuring the defects with very high resolution in a plane, while AFM is very accurate in measuring height related defects. However, each of these methods are too slow for HVM. Therefore optical microscopy/scatterometry is often the preferred method for defect detection in reticle metrology, due to its relative faster speed. However, this higher speed is only really obtainable when using DUV and higher wavelengths, which are resolution limited (i.e., unable to detect or characterize defects at the required resolution). Inspection at EUV and shorter wavelengths are photon limited (i.e., the amount of light available at these wavelengths is limited) which limits the throughput time, and is thus not economically viable for HVM.

Additionally, actinic radiation may be preferred as some printable defects (i.e., defects on the reticle which are imaged by EUV radiation as defects on the wafer) will not always be detected by radiation at other wavelengths, or using other metrology techniques. Actinic inspection radiation, in this context, is inspection radiation for reticle inspection which essentially has the same characteristics (particularly wavelength) as the imaging radiation for which the reticle is designed to pattern. By way of specific example, the actinic wavelength may be in the region of 13.5 nm for EUV reticles. However, the reflectivity of the EUV multilayer stacks applied to each EUV reticle substrate is typically optimized for reflection of 13.5 nm radiation at a 6 degree angle of incidence from surface normal. For defect detection with high throughput at a 13.5 nm wavelength, a very high brightness source is required which, should it even exist, is not economically viable for inspection applications. More specifically, when using a high harmonic generation (HHG) radiation source, only a very small number of harmonics, often only one, correlates with the 13.5 nm radiation. Because of this, the amount of radiation that is actually available at 13.5 nm is small and measurement will be slow. As such, there is no technique at present which can detect reticle defects with the required resolution and with the desired throughput.

Figure 3:
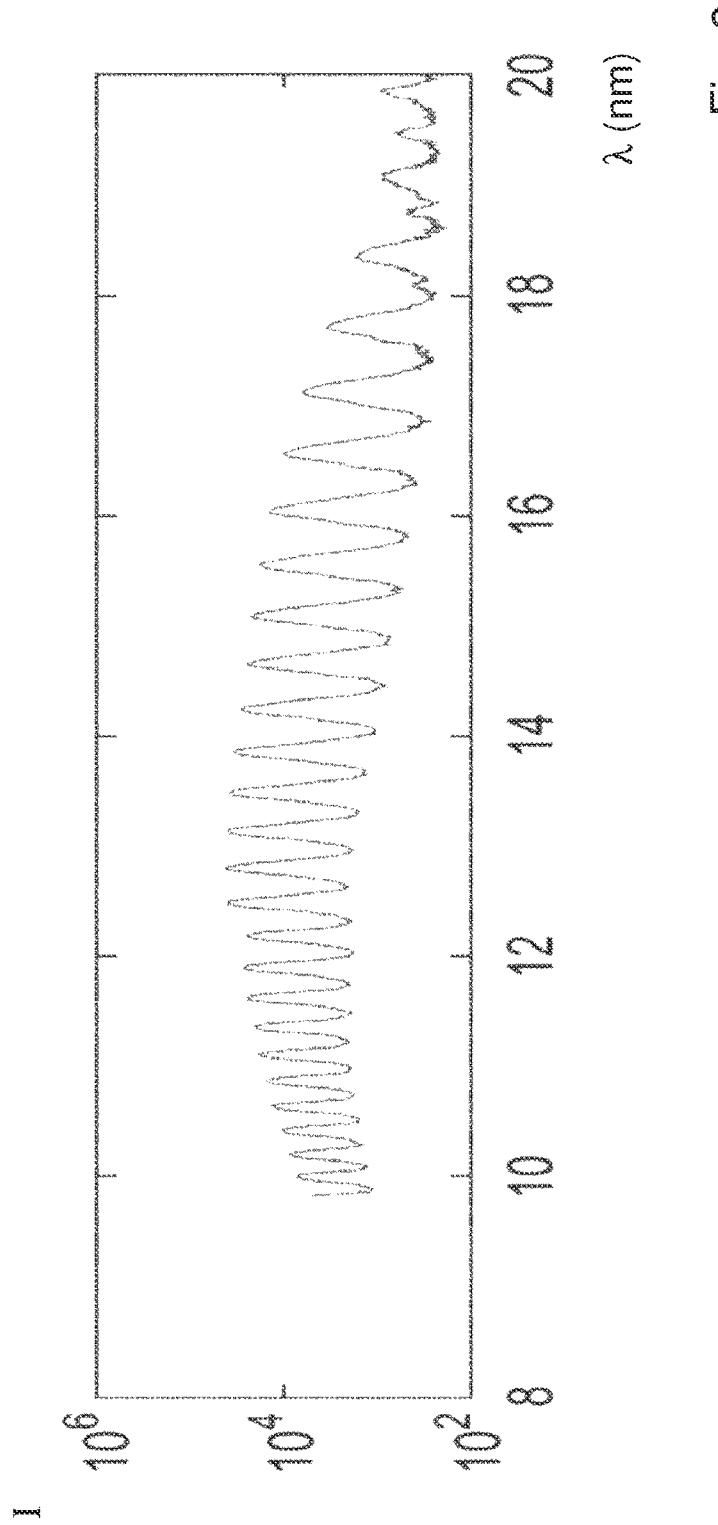
FIG. 3 is a plot showing a typical HHG emission spectrum for an HHG source using neon gas.

FIG. 3 shows a typical HHG emission spectrum for an HHG source using neon gas as a HHG generation medium, illustrating the above issue. The figure comprises intensity I on the y-axis against wavelength A (nm) on the x-axis. It can be seen from the figure that only a small number of peaks correlate with the desired 13.5 nm wavelength; the remaining peaks are typically filtered out.

To increase the number of photons available for measurement, it is proposed to perform defect inspection on a substrate using inspection radiation at one or more inspection wavelengths in a radiation range between 20 nm and 150 nm; more specifically the radiation range may be between 20 nm and 90 nm, between 20 nm and 70 nm, between 20 nm and 50 nm or between 20 nm and 35 nm.

The inspection radiation may comprise a wavelength that is approximately an integer multiple of an actinic wavelength for which the reticle is designed; in particular where the integer is 2 or 3. "Approximately" with respect to any stated wavelength value may define a range of +/−5 nm or +/−2 nm centered on the stated wavelength value. As such, the inspection radiation may comprise a plurality of wavelengths within a wavelength range as defined above, and which includes one wavelength which is approximately an integer multiple of an actinic wavelength. An advantage of this is that by including radiation at, for example, 27 nm (and, for example, at an "actinic" angle of incidence, which may be 6 degrees with respect to normal) approximately half of the layers of the substrate multilayer will be used for reflection and, therefore defects in the multilayer structure may be detectable.

To further increase the number of photons available, it is proposed, in an embodiment, that the inspection radiation specifically comprises radiation at a plurality of wavelengths. The brightness (amount of radiation available) at lower harmonics (higher wavelengths) can be orders of magnitude higher compared to that of the higher harmonics (lower wavelengths). Additionally, the emission spectrum can also be optimized for maximum brightness at desired wavelengths.

More specifically, the reflection spectrum of the substrate being inspected can be expected to be relatively constant over a few nm of wavelength range, and therefore many harmonics of a HHG source can be used for the inspection. Additionally, one or more HHG generation parameters may be optimized for brightness (i.e., amount of radiation produced) at the wavelength range of interest. For example, the pressure and/or species of the HHG generating medium (e.g., HHG generating gas comprised within HHG gas cell 432 in FIG. 2) and/or the wavelength of the pump laser used to excite the HHG generation medium may be so optimized. As such, the HHG generation parameters may be optimized for brightness in the 20-40 nm wavelength range, rather than in the range illustrated in FIG. 3. The publication "*High flux coherent super-continuum soft X-ray source driven by a single-stage, 10mJ, Ti:sapphire amplifier-pumped OPA*" Ding et al, OPTICS EXPRESS, Vol. 22, No. 5 shows different HHG emission spectra for different gas species (argon, neon, helium) at varying pressure and driving wavelength (wavelength of the pump laser), which illustrates how one or more HHG generation parameters, such as gas species, may be optimized for a preferred wavelength range. The content of this publication is incorporated herein by reference in its entirety.

Figure 4A:
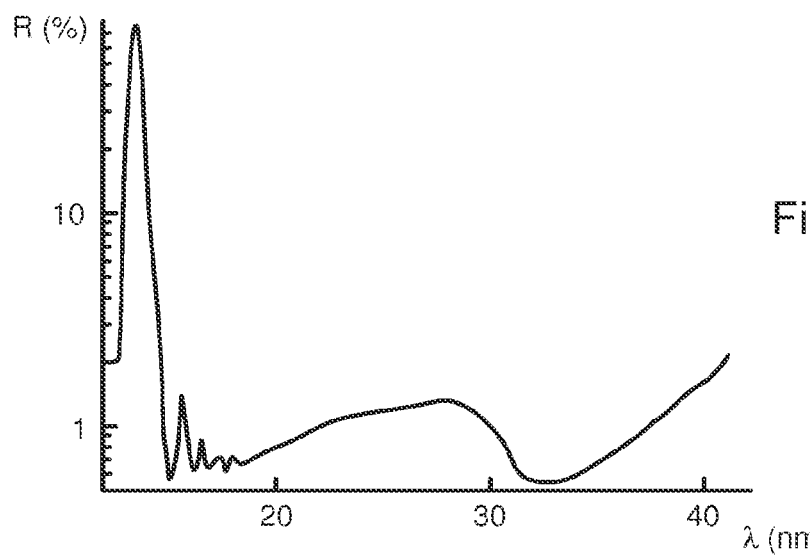
FIGS. 4 (a)-4 (c) comprise graphs of reflectivity R (%) on the y axis against wavelength A (nm) on the x axis for angles of incidence with respect to normal of FIG. 4(a) 0 degrees, FIG. 4(b) 45 degrees and FIG. 4(c) 60 degrees.
Figure 4B:
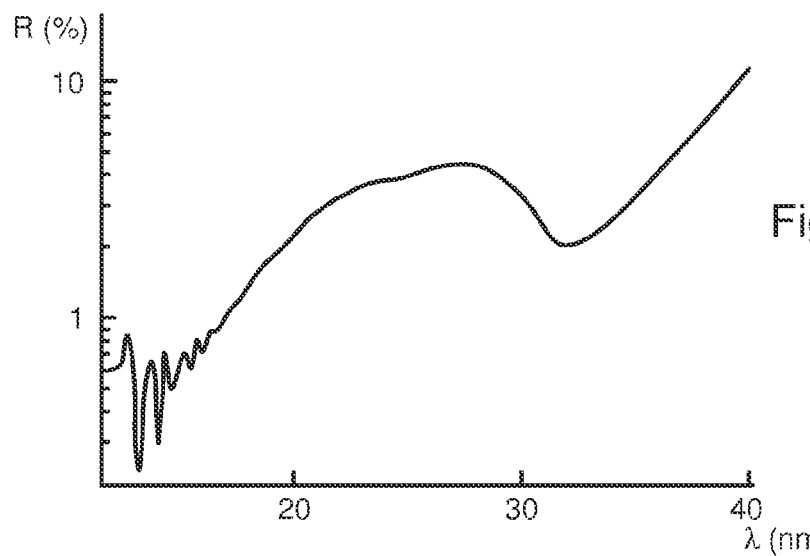
Figure 4C:
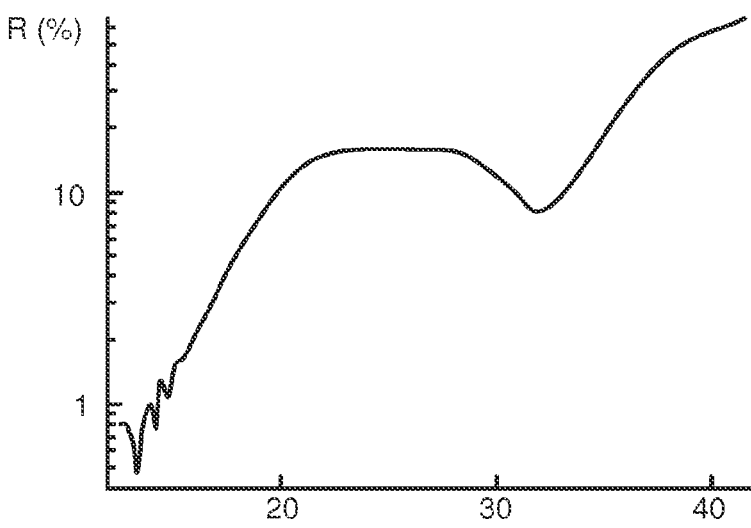

Another variable for increasing the number of photons available for measurement is the angle of incidence of the measurement radiation with respect to the substrate surface. FIG. 4, which shows graphs of reflectivity R (% on a log scale) on the y axis against wavelength A (nm) on the x axis for angles of incidence, with respect to normal, of: (a) 0 degrees, (b) 45 degrees and (c) 60 degrees. It can be observed that there is approximately 1% reflection from the multilayer at wavelengths in the range 25 nm-30 nm, at about normal incidence. By increasing the angle of incidence from normal to 45 degrees or 60 degrees with respect to normal, reflectivity at higher wavelengths (e.g., within the aforementioned 25 nm-30 nm range) can be increased by an order of magnitude; i.e., FIG. 4(c) shows reflectivity in the region of about 10% within this wavelength range.

As such, in an embodiment it is proposed that the inspection be performed with the inspection radiation impinging the substrate surface at an angle (relative to surface normal) of greater than 10 degrees, greater than 20 degrees, greater than 30, greater than 40 degrees or greater than 50 degrees; e.g., in a range of between 40 and 70 degrees.

In another embodiment, it is proposed to perform defect inspection on a reticle substrate in two stages: a coarse inspection using first inspection radiation having one or more first wavelengths that are all within a first wavelength range, e.g., between 20 nm and 150 nm; and a fine inspection using second inspection radiation having one or more second wavelengths that are all within a second wavelength range, e.g., less than 20 nm.

The first inspection radiation may comprise any of the parameter values and concepts relating to the inspection radiation and inspection techniques described in the aforementioned embodiments. As such, the first inspection radiation may comprise any of the narrower ranges, and/or may include a wavelength which is an integer multiple of an actinic wavelength, in the same manner as described in relation to the above embodiment. The first inspection radiation may comprise multiple wavelengths. Additionally, the coarse inspection may be performed at an angle (relative to surface normal) of greater than 10 degrees, greater than 20 degrees, greater than 30, greater than 40 degrees or greater than 50 degrees; e.g., the region of between 40 and 60 degrees, as already described.

The second inspection radiation may comprise actinic radiation, such that the second wavelength is an actinic wavelength. In a specific embodiment, the second inspection radiation may have a wavelength of approximately 13.5 nm The coarse inspection may be performed for fast scatterometry/imaging over the substrate. A fine inspection may then be performed, if required, using an actinic wavelength (e.g., 13.5 nm) for a more precise characterization of any defect detected during the coarse inspection and/or to ascertain whether the defect will be imaged in a production process. Even smaller wavelengths (e.g., smaller than 13.5 nm) may be used to obtain even greater resolution during the fine inspection.

In such an embodiment, the HHG generating medium may be individually optimized for brightness at each of the wavelength ranges of interest corresponding to both the coarse inspection and fine inspection. For example, a first HHG generating medium may be used for the coarse inspection stage and a second HHG generating medium (different to the first HHG generating medium) used for the fine inspection stage. In a specific example, the first HHG generating medium may be optimized for brightness in the 20-40 nm wavelength range, and the second HHG generating medium optimized for brightness at the actinic wavelength (e.g., approximately 13.5 nm) or other wavelength used during fine inspection.

In a further embodiment, instead of using a HHG source, an inverse Compton scattering (ICS) source may be used to generate the inspection radiation for at least the coarse inspection stage (and possibly for both coarse and fine inspection stages). Such an ICS source is described, for example, in WO 2017/025392 which is hereby incorporated by reference. For more detail of the implementation of an ICS source, reference is made to W S Graves et al, "Compact x-ray source based on burst-mode inverse Compton scattering at 100 kHz", Physical Review Special Topics—Accelerators and Beams 17, 120701 (2014). The contents of the Graves et al reference are incorporated herein by reference.

Figure 5:
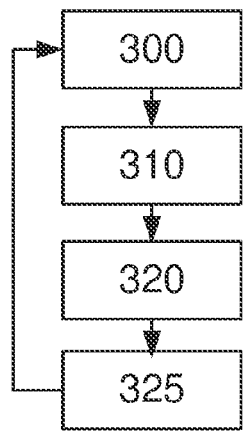
FIG. 5 is a flowchart of a method according to a first embodiment of the invention.

The concept of coarse inspection using inspection radiation having relatively longer wavelengths than those used for fine inspection may be implemented in different ways. In one embodiment, the coarse inspection and fine inspection may be performed sequentially per substrate. FIG. 5 is a flowchart illustrating such an embodiment. At step 300, a new substrate is loaded for inspection and at step 310, a coarse inspection is performed on a substrate to identify regions of interest having potential defects (i.e., any regions on the substrate for which the coarse inspection highlights a possible defect). At step 320, a fine inspection is performed on only those regions of interest identified at step 310. At step 325, the defect is characterized, e.g., by performing a reconstruction based on an image (e.g., a diffraction image) obtained in the fine inspection stage, so as to determine the type of defect and/or quantify its effect on any IC manufacturing process using the reticle. Should no potential defects be identified in the coarse inspection, then a fine inspection need not be performed on that substrate. The method returns to step 300 for the next substrate to be measured.

Figure 6:
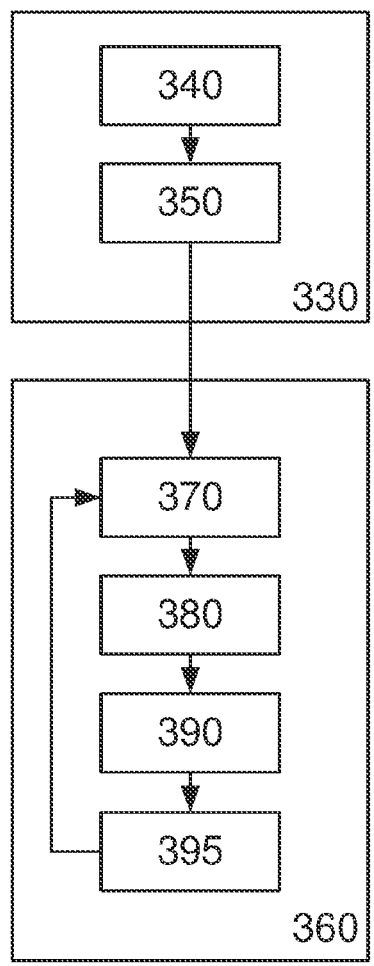
FIG. 6 is a flowchart of a method according to a second embodiment of the invention.

In an alternative embodiment, the inspection method may comprise a calibration step for which a one-to-one mapping of measurement signatures (e.g., diffraction image or pupil image or any other imaged signature indicative of a defect) using the coarse inspection radiation and the fine inspection radiation is made, thereby generating a library of corresponding defect signatures at the two wavelengths. The library can then be accessed during the manufacturing (HVM) stage instead of performing a fine inspection. FIG. 6 is a flowchart illustrating such an embodiment. In a calibration stage 330, at step 340, a number of different types of defect are inspected using relatively longer wavelength radiation (i.e., in the first wavelength range) and a resultant first diffraction image or other defect signature is recorded. At step 350, each of these defects are then inspected using relatively shorter wavelength radiation (i.e., in the second wavelength range) and, for each defect, the resultant second diffraction image or other defect signature is mapped to the corresponding first diffraction image or other defect signature for that defect. Then, during a manufacturing stage 360, a substrate is loaded (step 370) and a coarse inspection (step 380) is performed using radiation in the first wavelength range. At step 390, the library is accessed to identify the closest first signature match to the defect signature obtained at step 380. The corresponding second defect signature to this closest first signature is then used, at step 395, to characterize the defect (e.g., by way of reconstruction), and the method returns to step 370 for the next substrate.

The inspection methods used herein, including at each of the coarse inspection stage and fine inspection stage, may comprise any suitable method for measuring defects on a substrate. Such methods may comprise, for example, reflecting the inspection radiation off the substrate surface and imaging the reflected radiation. This reflected radiation can be compared to a reference level obtained from inspecting a defect free substrate or area thereof. Any substantial deviation from the reference can be taken to be indicative of a defect. As an alternative, the dark field (e.g., an imaged region where there is no scattered radiation in the absence of a defect) may be monitored, and any radiation detected in the dark field may be considered indicative of a defect. Such methods and other suitable methods can be found, for example, in Nakasuji et al, Development of Coherent Extreme-Ultraviolet Scatterometry Microscope with High-Order Harmonic Generation Source for Extreme-Ultraviolet Mask Inspection and Metrology, Japanese Journal of Applied Physics 51 (2012) and Na et al, Application of actinic mask review system for the preparation of HVM EUV lithography with defect free mask, Proc. of SPIE Vol. 10145. Both of these publications are hereby incorporated by reference in their entirety.

In Na et al, a scanning based imaging system is used which provides aerial images. Firstly, a HHG source generates 13.5 nm EUV light, which is delivered to the reticle (a multilayer mirror) and focused thereon by a zoneplate. Secondly, while the substrate stage scans the mask in X and Y directions, while each point intensity is detected at the detector and converted to electrical signals. Thirdly, the signals are digitized at the analog-to-digital converter and sent to the imaging processing unit. Finally, aerial images are reconstructed during the mask scans, this process being repeated until the scan ends. Inspection of the aerial image should reveal defects.

In Nakasuji et al, a coherent EUV scatterometry microscope (CSM), is used, which comprises a lensless system for actinic inspection and metrology. At the CSM, the mask is exposed to a coherent EUV light. A charge-coupled-device (CCD) camera records diffraction and scattering intensities from the mask directly, which contains amplitude information in the frequency space. CD values are evaluated using the diffraction intensities from the periodic patterns, and aerial images are reconstructed by the iterative calculation of Fourier and inverse-Fourier transforms. Defects are also observed from the diffraction images, e.g., as intensity spikes between the diffraction orders. Methods include reconstructing the aperiodic pattern image, reconstructing the phase structure as the amplitude and the phase image, and reconstructing a defect image.

Further embodiments are provided in the subsequent numbered clauses:

1. A method of inspection for detecting defects on a substrate for a reflective reticle, comprising:
   performing the inspection using first inspection radiation obtained from a high harmonic generation source and having one or more first wavelengths within a first wavelength range of between 20 nm and 150 nm.
2. A method as defined in clause 1, wherein the inspection step comprises using the first inspection radiation at an angle of incidence onto the substrate greater than 10 degrees with respect to the surface normal.
3. A method as defined in clause 1, wherein the inspection step comprises using the first inspection radiation at an angle of incidence onto the substrate greater than 40 degrees with respect to the surface normal.
4. A method as defined in any preceding clause, wherein the one or more first wavelengths comprise a plurality of wavelengths.
5. A method as defined in any preceding clause, wherein the one or more first wavelengths comprise a wavelength which is approximately an integer multiple of the wavelength of an actinic wavelength for which the reticle substrate has been optimized.
6. A method as defined in clause 5, wherein the integer is 2 or 3.
7. A method as defined in any preceding clause, wherein the first wavelength range is between 20 nm and 40 nm.
8. A method as defined in any preceding clause, wherein one or more high harmonic generation parameters of the high harmonic generation source is optimized for maximal photon generation at the one or more first wavelengths; the one or more high harmonic generation parameters comprising one or more of:
   the species of a high harmonic generation generating medium comprised within the high harmonic generation source for generating the first inspection radiation;
   the pressure of the high harmonic generation generating medium; and/or the wavelength of a pump laser used to excite the high harmonic generation generating medium.
9. A method as defined in any preceding clause, wherein the reflective reticle substrate comprises one of a:
   a bare substrate,
   a reticle blank with multilayer applied, or
   a patterned substrate comprising an absorber layer into which a pattern has been applied.
10. A method as defined in any preceding clause, wherein the performing an inspection using first inspection radiation is performed as part of a coarse inspection; and the method further comprises performing a fine inspection using second inspection radiation having one or more second wavelengths within a second wavelength range, the second wavelength range comprising wavelengths shorter than the first wavelength range.
11. A method as defined in clause 10, wherein the one or more first wavelengths are all comprised within the first wavelength range and the one or more second wavelengths are all comprised within the second wavelength range.
12. A method as defined in clause 10 or 11, wherein the first wavelength range and the second wavelength range are non-overlapping.
13. A method as defined in any of clauses 10 to 12, wherein the second inspection radiation comprises actinic radiation, such that the second wavelength comprises the wavelength for which the reflective reticle has been optimized.
14. A method as defined in any of clauses 10 to 13, wherein the second wavelength range comprises wavelengths smaller than 20 nm.
15. A method as defined in any of clauses 10 to 14, wherein the second inspection radiation comprises a second wavelength of approximately 13.5 nm.
16. A method as defined in any of clauses 10 to 15, wherein the coarse inspection is performed over the substrate surface to identify regions of interest indicative of the presence of a defect; and the fine inspection is performed only for the regions of interest for characterization of a defect.

17. A method as defined in any of clauses 10 to 16, wherein the coarse inspection and fine inspection are performed sequentially on each substrate being inspected.

18. A method as defined in any of clauses 10 to 16, wherein the coarse inspection and fine inspection are performed in a calibration step on calibration substrates to form a library of corresponding first defect signatures obtained from the coarse inspection and second defect signatures obtained from the fine inspection, the library being used to find corresponding second defect signatures and therefore characterize a defect based on a first defect signature obtained in a coarse inspection during an inspection step.

19. A method as defined in any of clauses 10 to 18, wherein one or more high harmonic generation parameters of the high harmonic generation source is optimized for maximal photon generation in the first wavelength range during the coarse inspection and in the second wavelength range during the fine inspection; the one or more high harmonic generation parameters comprising one or more of:
the species of a high harmonic generation generating medium comprised within the high harmonic generation source for generating the first inspection radiation;
the pressure of the high harmonic generation generating medium; and/or
the wavelength of a pump laser used to excite the high harmonic generation generating medium.

20. A method of inspection for detecting defects on a substrate for a reflective reticle, comprising:
performing a coarse inspection using first inspection radiation having one or more first wavelengths within a first wavelength range; and
performing a fine inspection using second inspection radiation having one or more second wavelengths within a second wavelength range, the second wavelength range comprising wavelengths shorter than the first wavelength range.

21. A method as defined in clause 20, wherein the coarse inspection is performed over the substrate surface to identify regions of interest indicative of the presence of a defect; and the fine inspection is performed only for the regions of interest for characterization of a defect.

22. A method as defined in clause 20 or 21, wherein the coarse inspection and fine inspection are performed sequentially on each substrate being inspected.

23. A method as defined in clause 20 or 21, wherein the coarse inspection and fine inspection are performed in a calibration step on calibration substrates to form a library of corresponding first defect signatures obtained from the coarse inspection and second defect signatures obtained from the fine inspection, the library being used to find corresponding second defect signatures and therefore characterize a defect based on a first defect signature obtained in a coarse inspection during an inspection step.

24. A method as defined in any of clauses 20 to 23, wherein the first inspection radiation and the second inspection radiation are obtained from a high harmonic generation source.

25. A method as defined in any of clauses 20 to 23, wherein the first inspection radiation and the second inspection radiation are obtained from an inverse Compton scattering source.

26. An inspection apparatus operable to perform the method of any of clauses 20 to 23.

27. An inspection apparatus as defined in clause 26, comprising a high harmonic generation source for generation of the first inspection radiation and the second inspection radiation.

28. An inspection apparatus as defined in clause 27, comprising a plurality of high harmonic generation media, comprising a first high harmonic generation medium for generation of the first inspection radiation in the first wavelength range during the coarse inspection and a second high harmonic generation medium for generation of the second inspection radiation in the second wavelength range during the fine inspection.

29. An inspection apparatus as defined in clause 28, operable such that the pressure of the first high harmonic generation medium and or the wavelength of the pump laser used to excite the first high harmonic generation medium is further optimized for generation of the first inspection radiation in the first wavelength range during the coarse inspection; and/or the pressure of the second high harmonic generation medium and or the wavelength of the pump laser used to excite the second high harmonic generation medium is further optimized for generation of the second inspection radiation in the second wavelength range during the fine inspection.

30. An inspection apparatus as defined in clause 27, comprising an inverse Compton scattering source for generation of the first inspection radiation and the second inspection radiation.

31. An inspection apparatus operable to perform the method of any of clauses 1 to 19.

32. An inspection apparatus as defined in any of clauses 26 to 31, comprising: a substrate holder for holding the substrate,
projection optics for projecting the inspection radiation onto the substrate; and a sensor for sensing the inspection radiation having been scattered and/or reflected from the substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multilayer IC, so that the term substrate used herein may also refer to a substrate that already contains multiple processed layers.

The terms "radiation" and "beam" used in relation to the lithographic apparatus, unless otherwise specified, encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of inspection for detecting a defect on a substrate for or of a reflective reticle, wherein the substrate is configured to be illuminated by radiation having an actinic wavelength to expose an object with a pattern of the reticle, the method comprising:
    performing a coarse inspection using a first inspection radiation having one or more first wavelengths within a first wavelength range between 20 nm and 150 nm; and
    performing a fine inspection using a second inspection radiation having one or more second wavelengths within a second wavelength range, the second wavelength range comprising wavelengths shorter than the first wavelength range and comprising the actinic wavelength.

2. The method of claim 1, wherein:
    the coarse inspection is performed over the substrate surface to identify regions of interest indicative of the presence of the defect; and
    the fine inspection is performed only for the regions of interest for characterization of the defect.

3. The method of claim 1, wherein the coarse inspection and fine inspection are performed sequentially on each substrate being inspected.

4. The method of claim 1, wherein the coarse inspection and fine inspection are performed in a calibration step on a calibration substrate to form a library of corresponding first defect signatures obtained from the coarse inspection and second defect signatures obtained from the fine inspection, the library being used to find corresponding second defect signatures and therefore characterize the defect based on a first defect signature obtained in the coarse inspection.

5. The method of claim 1, wherein the first inspection radiation and the second inspection radiation are obtained from a high harmonic generation source.

6. The method of claim 1, wherein the first inspection radiation and the second inspection radiation are obtained from an inverse Compton scattering source.

7. The method of claim 1, wherein the one or more first wavelengths comprise a wavelength which is approximately an integer multiple of the wavelength of the actinic wavelength.

8. The method of claim 1, further comprising optimizing for maximum brightness at the actinic wavelength.

9. The method of claim 1, further comprising using the first inspection radiation at an angle of incidence onto the substrate greater than 10 degrees with respect to surface normal.

10. The method of claim 1, wherein the fine inspection comprises detecting a detected defect during the coarse inspection, and/or to ascertain whether the detected defect will be imaged in a production process.

11. The method of claim 1, further comprising performing a reconstruction based on an image obtained in the fine inspection.

12. An inspection apparatus to inspect a substrate for or of a reflective reticle, wherein the substrate is configured to be illuminated by radiation having an actinic wavelength to expose a pattern from the reticle, the inspection apparatus comprising:
    one or more radiation sources configured to output a first inspection radiation having one or more first wavelengths within a first wavelength range between 20 nm and 150 nm toward the substrate and a second inspection radiation having one or more second wavelengths within a second wavelength range toward the substrate, the second wavelength range comprising wavelengths shorter than the first wavelength range and comprising the actinic wavelength; and
    a detector configured to detect radiation from the substrate for detecting a defect on the substrate,
    wherein the apparatus is configured to perform a coarse inspection of the substrate using the first inspection radiation and perform a fine inspection of the substrate using the second inspection radiation.

13. The inspection apparatus of claim 12, wherein the one or more radiation sources comprises a high harmonic generation source configured to generate the first inspection radiation and the second inspection radiation.

14. The inspection apparatus of claim 12, wherein the one or more radiation sources comprises a plurality of high harmonic generation media comprising a first high harmonic generation medium to generate the first inspection radiation during the coarse inspection and a second high harmonic generation medium to generate the second inspection radiation during the fine inspection.

15. The inspection apparatus of claim 14, configured such that a pressure of the first high harmonic generation medium and/or a wavelength of a pump laser used to excite the first high harmonic generation medium is optimized for generation of the first inspection radiation during the coarse inspection; and/or a pressure of the second high harmonic generation medium and/or a wavelength of a pump laser used to excite the second high harmonic generation medium is optimized for generation of the second inspection radiation during the fine inspection.

16. The inspection apparatus of claim 12, wherein the one or more radiation sources comprises an inverse Compton scattering source configured to generate the first inspection radiation and second inspection radiation.

17. The inspection apparatus of claim 12, wherein the one or more first wavelengths comprise a wavelength which is approximately an integer multiple of the wavelength of the actinic wavelength.

18. The inspection apparatus of claim 12, further configured to provide the first inspection radiation at an angle of incidence onto the substrate greater than 10 degrees with respect to surface normal.

19. The inspection apparatus of claim 12, configured to optimize for maximum brightness at the actinic wavelength.

20. The inspection apparatus of claim 12, configured to perform a reconstruction based on an image obtained in the fine inspection.

* * * * *